(12) United States Patent
Kang (10) Patent No.: US 8,008,765 B2
(45) Date of Patent: Aug. 30, 2011

(54) SEMICONDUCTOR PACKAGE HAVING ADHESIVE LAYER AND METHOD OF MANUFACTURING THE SAME

(75) Inventor: In-ku Kang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 123 days.

(21) Appl. No.: 12/554,166

(22) Filed: Sep. 4, 2009

(65) Prior Publication Data

US 2010/0123236 A1    May 20, 2010

(30) Foreign Application Priority Data

Nov. 19, 2008    (KR) .................. 10-2008-0115325

(51) Int. Cl.
*H01L 23/02* (2006.01)
*H01L 23/48* (2006.01)

(52) U.S. Cl. .. 257/686; 257/777; 257/723; 257/E23.169

(58) Field of Classification Search .................. 257/686, 257/777, E23.169
See application file for complete search history.

(56) References Cited

U.S. PATENT DOCUMENTS

| | | | | |
|---|---|---|---|---|
| 5,648,684 A * | 7/1997 | Bertin et al. | ................... | 257/685 |
| 5,907,178 A * | 5/1999 | Baker et al. | ................... | 257/433 |
| 6,376,904 B1 * | 4/2002 | Haba et al. | ..................... | 257/686 |
| 6,569,709 B2 * | 5/2003 | Derderian | ...................... | 438/109 |
| 6,611,052 B2 * | 8/2003 | Poo et al. | ....................... | 257/686 |
| 7,282,793 B2 * | 10/2007 | Akram | ........................... | 257/686 |
| 7,576,431 B2 * | 8/2009 | Takahashi | ...................... | 257/777 |
| 7,812,449 B2 * | 10/2010 | Kuan et al. | ..................... | 257/738 |
| 2002/0096755 A1 * | 7/2002 | Fukui et al. | .................... | 257/686 |
| 2004/0229401 A1 * | 11/2004 | Bolken et al. | ................. | 438/109 |
| 2004/0245652 A1 * | 12/2004 | Ogata | ........................... | 257/777 |
| 2006/0197211 A1 * | 9/2006 | Miyata et al. | ................. | 257/686 |
| 2007/0278657 A1 * | 12/2007 | Lee | ............................... | 257/692 |
| 2009/0001602 A1 * | 1/2009 | Chung | ........................... | 257/777 |
| 2009/0014891 A1 * | 1/2009 | Chang et al. | .................. | 257/777 |
| 2009/0065950 A1 * | 3/2009 | Lee et al. | ....................... | 257/777 |

FOREIGN PATENT DOCUMENTS

| | | |
|---|---|---|
| JP | 2007-281129 | 10/2007 |
| KR | 1020050003762 | 1/2005 |
| KR | 1020080026418 | 3/2008 |

* cited by examiner

*Primary Examiner* — Nitin Parekh
(74) *Attorney, Agent, or Firm* — F. Chau & Associates, LLC (57) ABSTRACT

A semiconductor package includes a first substrate comprising a plurality of pads arranged in a first side of the first substrate, a plurality of first semiconductor chips stacked on the first side of the first substrate and each first semiconductor chip comprising a plurality of chip pads arranged in a first side of respective first semiconductor chips, and a sealant arranged on the first substrate, the sealant sealing the first semiconductor chips, wherein at least one of the first semiconductor chips comprises a plurality of redistribution pads arranged in the first side of the at least one semiconductor chip, and a plurality of adhesive layers having portions exposed by the sealant, each adhesive layer is disposed on respective redistribution pads.

17 Claims, 6 Drawing Sheets

SEMICONDUCTOR PACKAGE HAVING ADHESIVE LAYER AND METHOD OF MANUFACTURING THE SAME

CROSS-REFERENCE TO RELATED APPLICATION

This application claims priority to Korean Patent Application No. 10-2008-0115325, filed on Nov. 19, 2008, the disclosure of which is incorporated herein in its entirety by reference.

BACKGROUND OF THE INVENTION

1. Technical Field

The present disclosure relates to a semiconductor package and a method of manufacturing the same, and more particularly, to a semiconductor package having an adhesive layer and a method of manufacturing the same.

2. Discussion of Related Art

A semiconductor package may include a plurality of semiconductor chips disposed therein. The semiconductor package can be formed on another semiconductor package to increase density in an electronic device.

For example, Package-on-Package (PoP) is an integrated circuit packaging technique to allow vertically combining discrete logic and memory ball grid array (BGA) packages. In PoP, a solder ball can be formed to electrically connect two semiconductor packages, for example, an upper semiconductor package and a lower semiconductor package. However, when the solder ball is disposed directly on a ball pad, a bonding strength between the solder ball and the ball pad is low.

SUMMARY OF THE INVENTION

In an exemplary embodiment, a semiconductor package includes an adhesive layer disposed on a redistribution pad.

According to an exemplary embodiment of the present invention, a semiconductor package comprises a first substrate comprising a plurality of pads arranged in a first side of the first substrate, a plurality of first semiconductor chips stacked on the first side of the first substrate and each first semiconductor chip comprising a plurality of chip pads arranged in a first side of respective first semiconductor chips, and a sealant arranged on the first substrate, the sealant sealing the first semiconductor chips, wherein at least one of the first semiconductor chips comprises a plurality of redistribution pads arranged in the first side of the at least one semiconductor chip, and a plurality of adhesive layers having portions exposed by the sealant, each adhesive layer is disposed on respective redistribution pads.

The redistribution pads may comprise at least one of Cu/Ni/Au or Al.

The sealant may comprise an epoxy molding compound (EMC).

The chip pads of the first semiconductor chips can be connected to the pads of the first substrate by using a plurality of wires.

The at least one semiconductor chip may comprise a semiconductor chip arranged in an uppermost position.

The uppermost semiconductor chip may comprise a plurality of chip pads for redistribution arranged in the first side of the first substrate, and a plurality of redistribution lines electrically connecting the plurality of chip pads for redistribution and the redistribution pads.

Portions of the redistribution lines can function as the redistribution pads.

The uppermost semiconductor chip may further comprise an insulating layer arranged between the chip pads for redistribution and the redistribution lines, the insulating layer exposing the portions of the redistribution lines.

The adhesive layers may comprise a plurality of solders.

The semiconductor package may further comprise a package stacked to electrically connect to the exposed portions of the adhesive layers by using a plurality of connection terminals.

The adhesive layers and the connection terminals may comprise the same material.

The adhesive layers and the connection terminals may comprise a plurality of solders.

The package may comprise a second substrate comprising a plurality of connection pads arranged in a first side of the second substrate.

One or more second semiconductor chips can be arranged on a first side of the second substrate, wherein each connection terminal can be arranged on respective connection pads.

The second semiconductor chips can be stacked on a second side of the second substrate, and a plurality of chip pads of the second semiconductor chips can be connected to a plurality of pads arranged on the second side of the second substrate by using a plurality of wires.

The first and second semiconductor chips can comprise memory chips.

The first semiconductor chips may comprise memory chips, and the second semiconductor chips comprise a logic chip arranged on the first side of the second substrate.

According to an exemplary embodiment of the present invention, a method of forming a semiconductor device comprises forming a chip pad on a wafer, forming a passivation layer on the chip and on the wafer, removing a portion of the passivation layer to expose the chip pad, forming a redistribution line on the chip pad and the passivation layer, forming an adhesive layer on the redistribution line, forming an insulating layer on the passivation layer and the redistribution line, and removing a portion of the insulating layer to expose the adhesive layer.

Forming the adhesive layer may comprise arranging a solder ball on the redistribution line, and performing a reflow process to melt the solder ball.

Forming the adhesive layer may comprise plating a solder on the redistribution line by using electroplating or electroless plating.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF EXEMPLARY EMBODIMENTS

The present invention will now be described more fully with reference to the accompanying drawings in which example embodiments of the invention are shown. This invention may, however, be embodied in many different forms and should not be construed as limited to the exemplary embodiments set forth herein.

Figure 1:
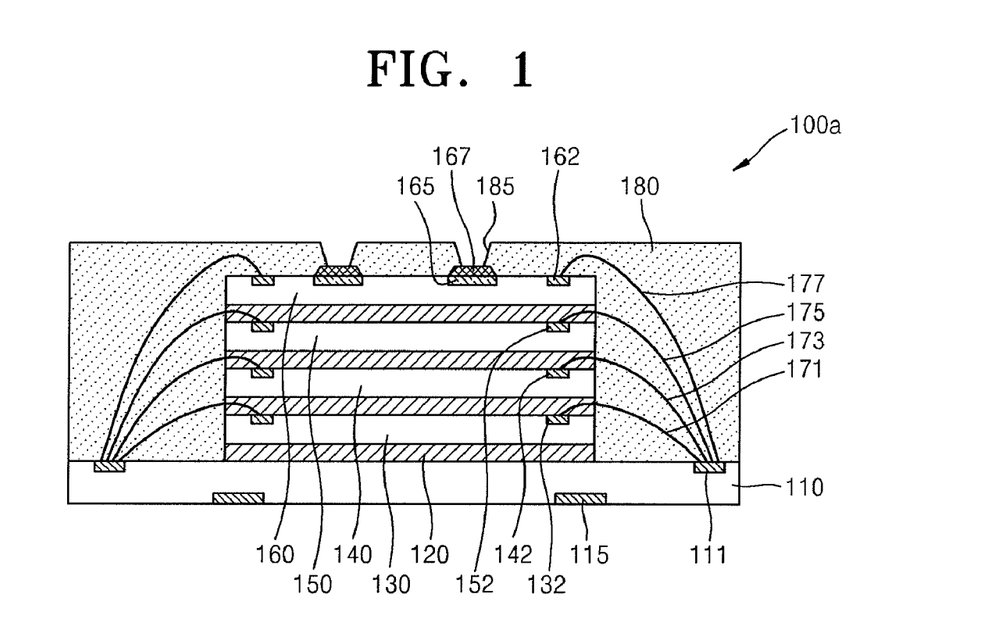
FIG. 1 is a cross-sectional view of a semiconductor package according to an exemplary embodiment of the present invention.

FIG. 1 is a cross-sectional view of a semiconductor package 100a according to an exemplary embodiment of the present invention. Referring to FIG. 1, the semiconductor package 100a includes a substrate 110 and a plurality of semiconductor chips 130, 140, 150, and 160, which are stacked on the substrate 110. A plurality of bonding pads 111 may be arranged in a first side of the substrate 100, and a plurality of connection pads 115 may be arranged in a second side of the substrate 100. An adhesive 120 may be interposed between the semiconductor chips 130, 140, 150, and 160. In an exemplary embodiment, four of the adhesive 120 are disposed in the semiconductor package 100a as shown in FIG. 1. The semiconductor chips 130, 140, 150, and 160 may include memory chips according to an exemplary embodiment of the present invention.

The semiconductor chips 130, 140, 150, and 160 may include a plurality of chip pads 132, 142, 152, and 162, respectively, which are arranged in a first side of each of the semiconductor chips 130, 140, 150, and 160. The first side can be, for example, an active surface of each of the semiconductor chips 130, 140, 150, and 160. Each of the chip pads 132, 142, 152, and 162 may be electrically connected to the bonding pads 111 of the substrate 110 by using each of a plurality of wires 171, 173, 175, and 177.

The semiconductor chip 160 arranged in an uppermost position of the semiconductor chips 130, 140, 150, and 160 may include a plurality of redistribution pads 165. The redistribution pads 165 may electrically connect to an external device according to an exemplary embodiment of the present invention. A plurality of adhesive layers 167 may be arranged on the redistribution pads 165, respectively. The adhesive layers 167 may include solders according to an exemplary embodiment of the present invention.

The semiconductor package 100a may include a sealant 180, which is arranged on the first side of the substrate 110 to cover the semiconductor chips 130, 140, 150, and 160, the wires 171, 173, 175, and 177, the bonding pads 111, the chip pads 162, and the adhesive layers 167. The sealant 180 may include, for example, an epoxy molding compound (EMC). The sealant 180 may include openings 185 through which portions of the adhesive layers 167 are exposed. A plurality of solder balls may be arranged on the exposed portions of the adhesive layers 167, respectively, to provide an electrical connection with the external device.

Figure 2A:
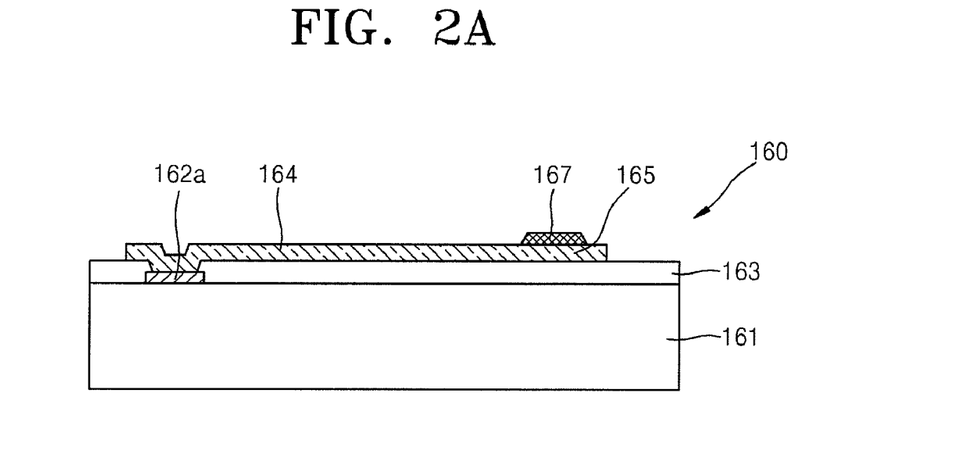
FIGS. 2A and 2B are cross-sectional views of an uppermost semiconductor chip of a semiconductor package according to an exemplary embodiment of the present invention.
Figure 2B:
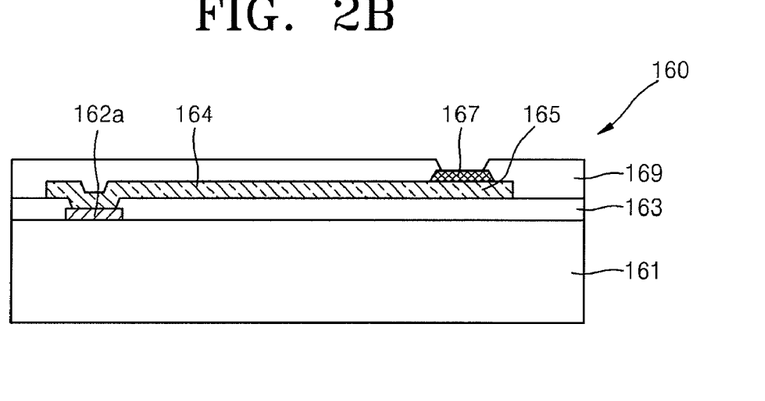

FIGS. 2A and 2B are cross-sectional views of the uppermost semiconductor chip 160 according to an exemplary embodiment of the present invention. Referring to FIGS. 2A and 2B, in the uppermost semiconductor chip 160, a chip pad 162a is arranged on a wafer 161. The chip pad 162a for redistribution may be arranged on the same side of the wafer 161 as the chip pads 162. A passivation layer 163 through which a portion of the chip pad 162a is exposed is formed on the wafer 161. A plurality of interlayer dielectrics (ILD) may be arranged on the passivation layer 163.

A redistribution line 164 is arranged on the passivation layer 163 and is electrically connected to the exposed portion of the chip pad 162a. A portion of the redistribution line 164 may function as the redistribution pad 165. The adhesive layer 167 may be arranged on the redistribution pad 165. The redistribution pad 165 may include, for example, Cu/Ni/Au or Al. The adhesive layer 167 may include, for example, a solder. An insulating layer 169 through which a portion of the adhesive layer 167 is exposed may be arranged on the redistribution line 164 and the passivation layer 163.

Figure 3:
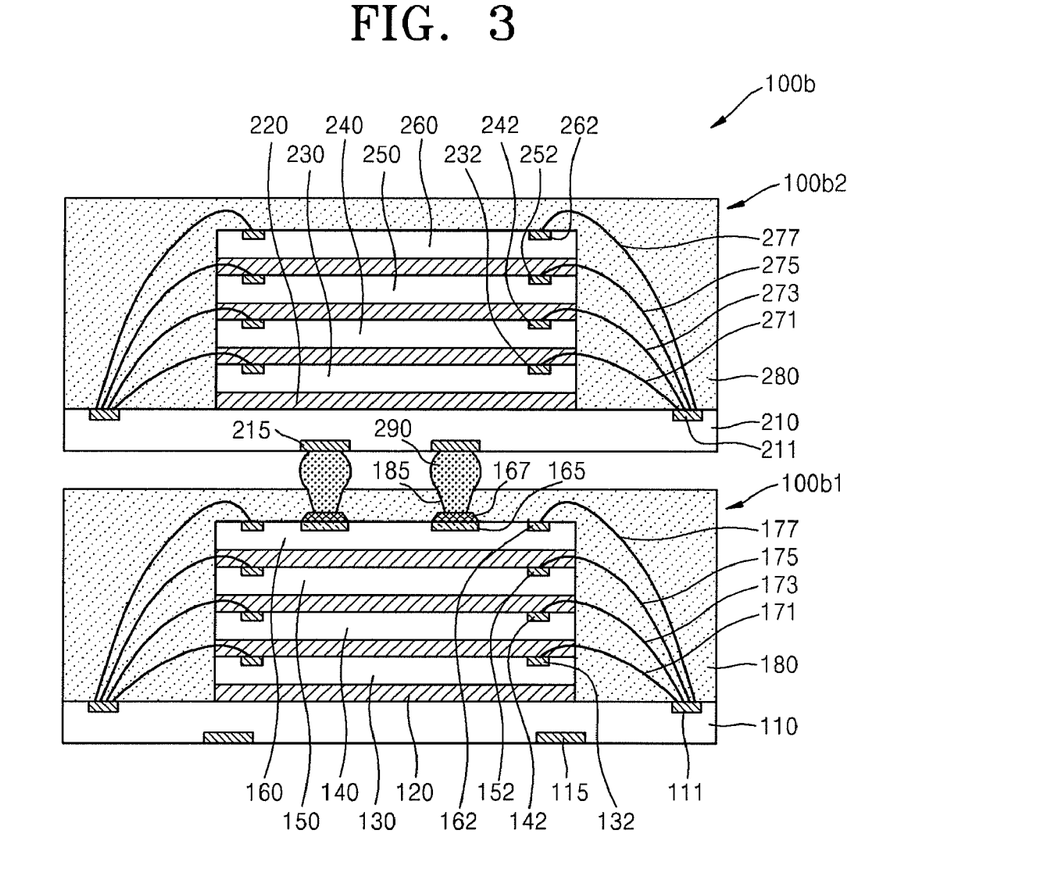
FIG. 3 is a cross-sectional view of a semiconductor package according to an exemplary embodiment of the present invention.

FIG. 3 is a cross-sectional view of a semiconductor package 100b according to an exemplary embodiment of the present invention. Referring to FIG. 3, the semiconductor package 100b may include, for example, a lower package 100b1 and an upper package 100b2 that is arranged on the lower package 100b1. The lower package 100b1 may have substantially the same structure as the semiconductor package 100a of FIG. 1. The upper package 100b2 may have substantially the same structure as the lower package 100b1.

The upper package 100b2 includes a substrate 210 and a plurality of semiconductor chips 230, 240, 250, and 260, which are stacked on the substrate 210. An adhesive 220 may be interposed between the semiconductor chips 230, 240, 250, and 260. Each of a plurality of chip pads 232, 242, 252, and 262 is arranged in a first side of each of the semiconductor chips 230, 240, 250, and 260 and is electrically connected to each of a plurality of bonding pads 211 through a plurality of wires 271, 273, 275 and 277. The plurality of bonding pads 211 are arranged in a first side of the substrate 210. The semiconductor chips 230, 240, 250, and 260 may include memory chips according to an exemplary embodiment of the present invention.

A plurality of connection pads 215 are arranged in a second side of the substrate 210. The connection pads 215 may be connected to a plurality of adhesive layers 167 of the lower package 100b1 by using a plurality of connection terminals 290 respectively. The connection pads 215 may provide an electrical connection between the upper package 100b2 and the lower package 100b1. The connection terminals 290 may include, for example, solder balls. The upper package 100b2 may include a sealant 280, which seals the semiconductor chips 230, 240, 250, and 260 and the wires 271, 273, 275, and 277.

Like in the lower package 100b1, in the upper package 100b2, a plurality of redistribution pads and a plurality of adhesive layers may be arranged in a first side of the uppermost semiconductor chip 260, and the adhesive layers may be exposed through the sealant 280.

Figure 4:
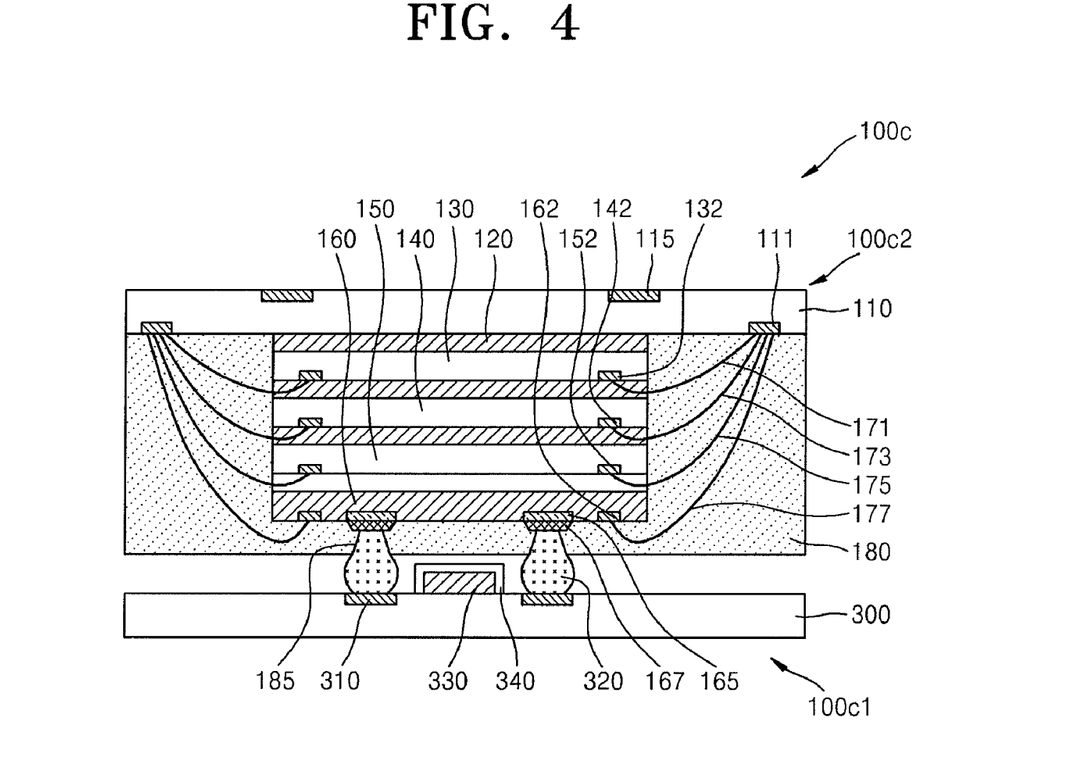
FIG. 4 is a cross-sectional view of a semiconductor package according to an exemplary embodiment of the present invention.

FIG. 4 is a cross-sectional view of a semiconductor package 100c according to an exemplary embodiment of the present invention. Referring to FIG. 4, the semiconductor package 100c may include a lower package 100c1 and an upper package 100c2 that is arranged on the lower package 100c1. The lower package 100c1 may include a substrate 300 and a semiconductor chip 330. The semiconductor chip 330 may include, for example, a logic chip. The substrate 300 may include, for example, a printed circuit board (PCB). The semiconductor chip 330 may be sealed by a sealant 340.

According to an exemplary embodiment of the present invention, the semiconductor chip 330 may be attached to the substrate 300 by using an adhesive, and a plurality of chip pads of the semiconductor chip 330 may be connected to a plurality of bonding pads arranged in a first side of the substrate 300 by using a plurality of wires. Alternatively, the semiconductor chip 330 may be flip chip bonded to a plurality of ball pads of the substrate 300 by using a plurality of solder balls. The substrate 300 may include a plurality of connection pads, which are arranged in a second side of the substrate 300. A plurality of connection terminals 320 connected to an external device, respectively, are arranged on the substrate 300.

The upper package 100c2 may have substantially the same structure as the semiconductor package 100a of FIG. 1. A plurality of adhesive layers 167 are arranged on a plurality of redistribution pads 165 of the upper package 100c2, respectively. The adhesive layers 167 are connected to the ball pads 310 of the substrate 300 via the connection terminals 320, respectively. The adhesive layers 167 may electrically connect the upper package 100c2 to the lower package 100c1 through, for example, the contact terminal 320.

Figure 5:
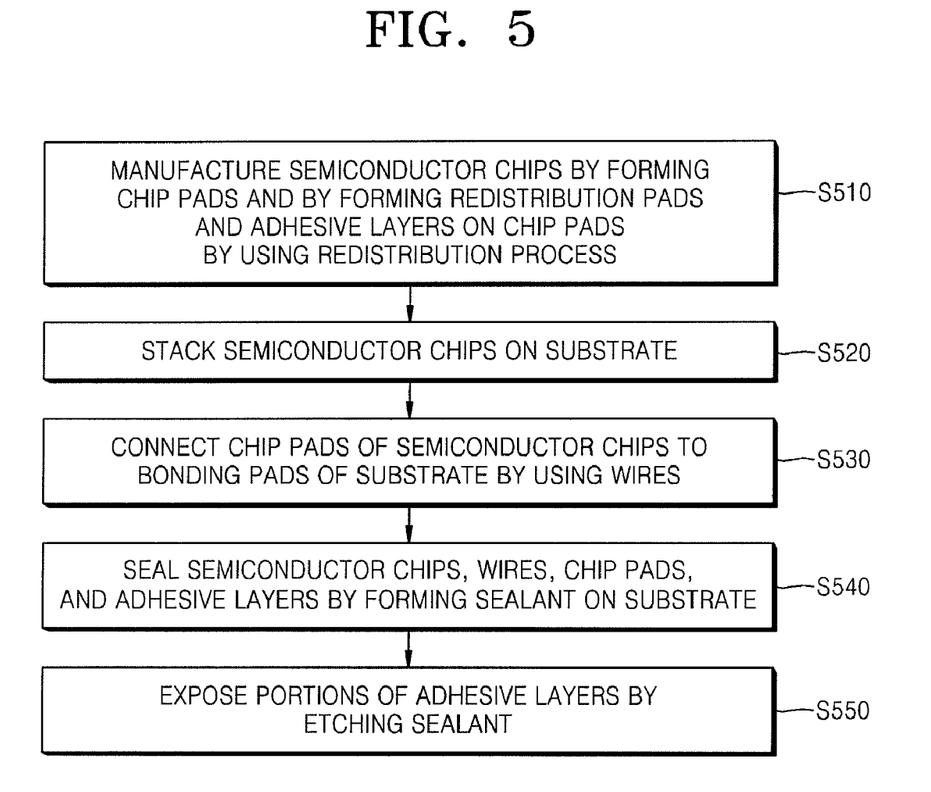
FIG. 5 is a flowchart illustrating a method of manufacturing a semiconductor package according to an exemplary embodiment of the present invention.

FIG. 5 is a flowchart illustrating a method of manufacturing the semiconductor package 100a according to an exemplary embodiment of the present invention. Referring to FIGS. 1 and 5, the semiconductor chips 130, 140, 150 and 160 in which each of the chip pads 132, 142, 152, and 162 is arranged in a first side of each of the semiconductor chips 130, 140, 150, and 160, are manufactured (S510). In an exemplary embodiment, at least one semiconductor chip 160 of the semiconductor chips 130, 140, 150, and 160 may include the redistribution pads 165 arranged in a first side of the semiconductor chip 160 by using a redistribution process. The adhesive layers 167 may be arranged on the redistribution pads 165, respectively.

Figure 6A:
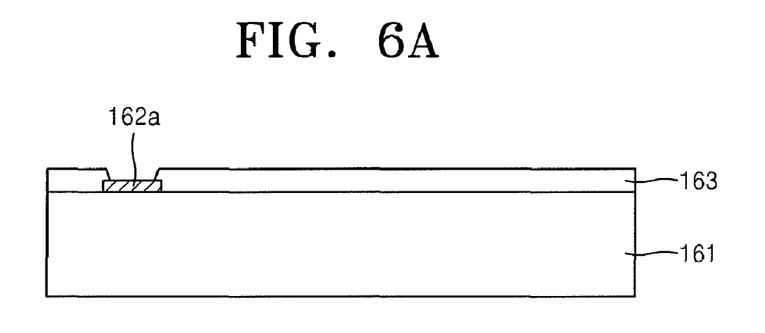
FIGS. 6A through 6E are cross-sectional views illustrating a method of manufacturing an uppermost semiconductor chip according to an exemplary embodiment of the present invention.

FIGS. 6A through 6E are cross-sectional views illustrating a method of forming the redistribution pads 165 and the adhesive layers 167 according to an exemplary embodiment of the present invention. Referring to FIGS. 1 and 6A, the chip pads 162 for wire bonding and the chip pads 162a for redistribution are formed on the wafer 161. The passivation layer 163 is formed on the wafer 161 so that portions of the chip pads 162 and 162a can be exposed. Thus, the semiconductor chips 130, 140, 150, and 160 may be manufactured.

Figure 6B:
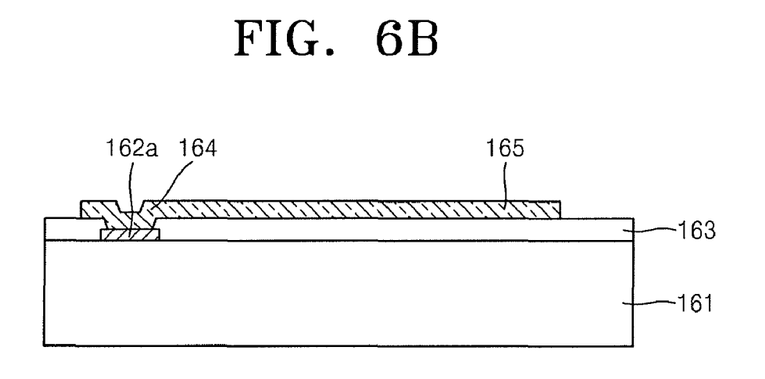

Referring to FIG. 6B, the redistribution line 164 is formed on at least one of the semiconductor chips 130, 140, 150, and 160 by using a redistribution process. In an exemplary embodiment, the redistribution line 164 is formed on the passivation layer 163. The redistribution line 164 may include a three-level layer such as Cu/Ni/Au or an Al single layer. The redistribution line 164 is connected to the exposed portion of the chip pad 162a, and a portion of the redistribution line 164 functions as a redistribution pad.

Figure 6C:
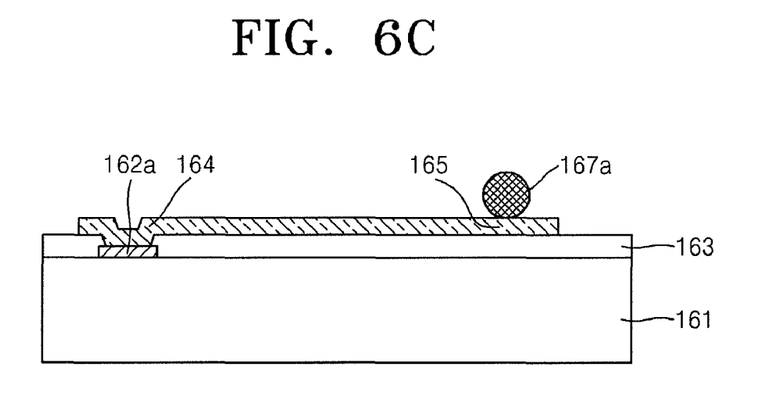
Figure 6D:
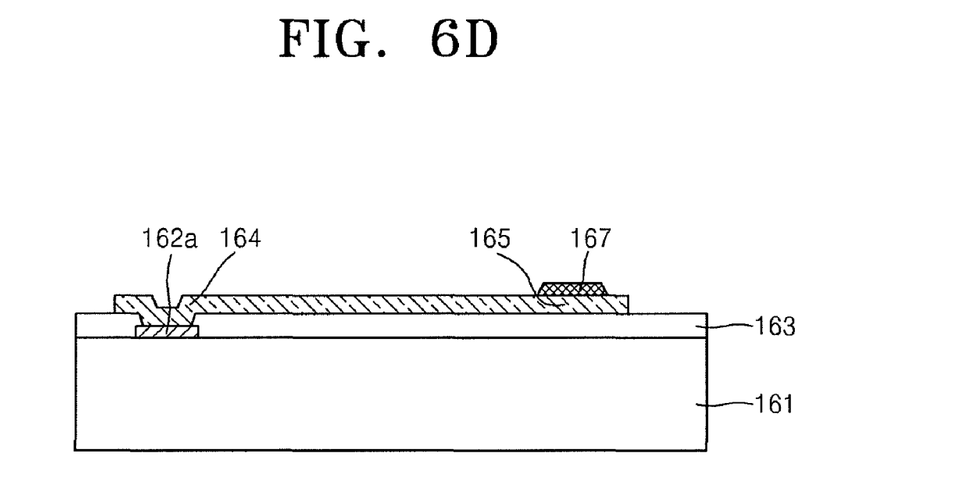

Referring to FIGS. 6C and 6D, the adhesive layers 167 are formed on the redistribution pads 165, respectively. In an exemplary embodiment, each of the adhesive layers 167 may be formed by arranging a solder ball 167a on the redistribution pads 165 and by performing a reflow process so that the solder ball 167a can be melted. In an exemplary embodiment, each of the adhesive layers 167 may be formed by plating a solder on the redistribution pads 165 by using electroplating or electroless plating. In an exemplary embodiment, each of the adhesive layers 167 may be formed by screen printing a flux and a solder paste on the redistribution pads 165 and by performing a reflow process.

Figure 6E:
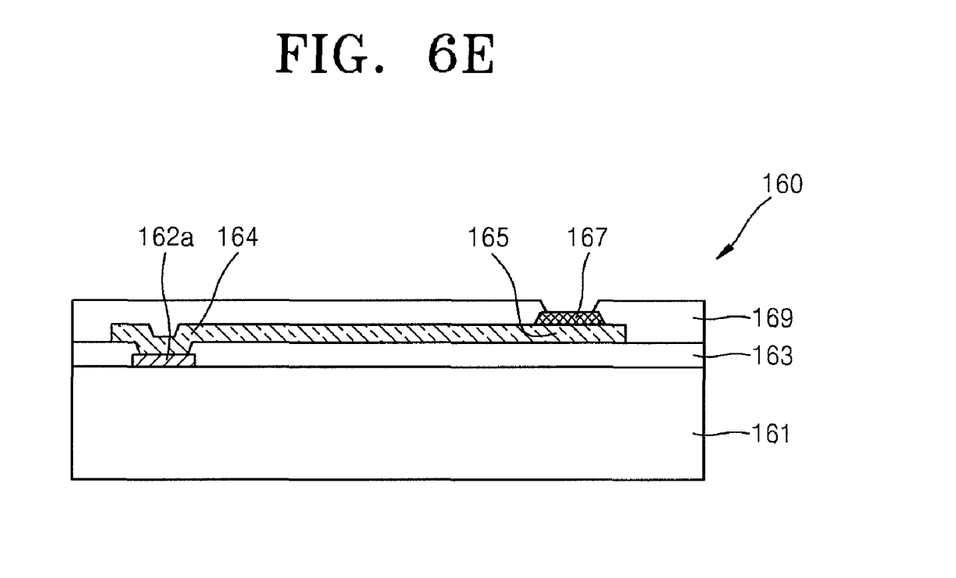

Referring to FIG. 6E, the insulating layer 169 through which the adhesive layers 167 and the chip pads 162 are exposed may be formed on the passivation layer 163 and the redistribution line 164.

Referring to FIGS. 1 and 5, the semiconductor chips 130, 140, 150, and 160 are stacked on the substrate 110 (S520). In an exemplary embodiment, the semiconductor chip 160 of the semiconductor chips 130, 140, 150, and 160, in which the redistribution pads 165 and the adhesive layers 167 are arranged, may be arranged in an uppermost position. Subsequently, the chip pads 132, 142, 152 and 162 of the semiconductor chips 130, 140, 150, and 160 are electrically connected to the bonding pads 111 of the substrate 110 by using the wires 171, 173, 175, and 177 (S530).

The sealant 180 is formed on the substrate 110 and seals the semiconductor chips 130, 140, 150, and 160, the wires 171, 173, 175, and 177, the chip pads 162, and the adhesive layers 167 (S540). Portions of the adhesive layers 167 may be exposed by etching the sealant 180 (S550). Thus, the semiconductor package 100a of FIG. 1 is manufactured according to an exemplary embodiment of the present invention.

Referring to the semiconductor package 100b of FIG. 3, the lower package 100b1 and the upper package 100b2 are manufactured by using an exemplary method of the present invention and then may be electrically connected to each other by using the solder balls (connection terminals) 290. Referring to the semiconductor package 100c of FIG. 4, the upper package 100c2 may be manufactured by using an exemplary method of the present invention and then may be electrically connected to the lower package 100c1 by using the solder balls (connection terminals) 320.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor package comprising:
    a first substrate comprising a plurality of pads arranged in a first side of the first substrate;
    a plurality of first semiconductor chips stacked and vertically aligned on the first side of the first substrate, each first semiconductor chip being directly electrically connected to the first substrate, and each first semiconductor chip comprising a plurality of chip pads arranged in a first side of respective first semiconductor chips; and
    a sealant arranged on the first substrate, the sealant partially sealing the first semiconductor chips,
    wherein at least one of the first semiconductor chips comprises:
    a plurality of redistribution pads arranged in the first side of the at least one semiconductor chip; and
    a plurality of adhesive layers having portions exposed by the sealant, each adhesive layer is disposed on respective redistribution pads.

2. The semiconductor package of claim 1, wherein the redistribution pads comprise at least one of Cu/Ni/Au or Al.

3. The semiconductor package of claim 1, wherein the sealant comprises an epoxy molding compound (EMC).

4. The semiconductor package of claim 1, wherein the chip pads of each of the first semiconductor chips are connected to the respective pads of the first substrate by using a plurality of wires.

5. The semiconductor package of claim 1, wherein the at least one semiconductor chip comprises a semiconductor chip arranged in an uppermost position.

6. The semiconductor package of claim 5, wherein the uppermost semiconductor chip comprises:
    a plurality of chip pads for redistribution arranged in the first side of the uppermost semiconductor chip; and a plurality of redistribution lines electrically connecting the plurality of chip pads for redistribution and the redistribution pads, respectively.

7. The semiconductor package of claim 6, wherein portions of the redistribution lines function as the redistribution pads.

8. The semiconductor package of claim 7, wherein the uppermost semiconductor chip further comprises an insulating layer arranged between the chip pads for redistribution and the redistribution lines, the insulating layer exposing the portions of the redistribution lines.

9. The semiconductor package of claim 1, wherein the adhesive layers comprise a plurality of solders.

10. The semiconductor package of claim 1, further comprising a package stacked to electrically connect to the exposed portions of the adhesive layers by using a plurality of connection terminals.

11. The semiconductor package of claim 10, wherein the adhesive layers and the connection terminals comprise the same material.

12. The semiconductor package of claim 11, wherein the adhesive layers and the connection terminals comprise a plurality of solders.

13. The semiconductor package of claim 10, wherein the package comprises:

a second substrate comprising a plurality of connection pads arranged in a second side of the second substrate.

14. The semiconductor package of claim 13, wherein each connection terminal is arranged on respective connection pads.

15. The semiconductor package of claim 13, wherein one or more second semiconductor chips are stacked and vertically aligned on a first side of the second substrate, and a plurality of chip pads of each of the second semiconductor chips are connected to a plurality of respective pads arranged on the first side of the second substrate by using a plurality of wires.

16. The semiconductor package of claim 15, wherein the first and second semiconductor chips comprise memory chips.

17. The semiconductor package of claim 15, wherein the first semiconductor chips comprise memory chips, and the second semiconductor chips comprise a logic chip arranged on the second side of the second substrate.

* * * * *